United States Patent
Morioka et al.

(10) Patent No.: US 7,254,861 B2
(45) Date of Patent: Aug. 14, 2007

(54) DEVICE FOR CLEANING TIP AND SIDE SURFACES OF A PROBE

(75) Inventors: Izuru Morioka, Tokyo (JP); Satoru Sato, Tokyo (JP)

(73) Assignee: NIHON Micro Coating Co., Ltd., Tokyo (JP)

(*) Notice: Subject to any disclaimer, the term of this patent is extended or adjusted under 35 U.S.C. 154(b) by 202 days.

(21) Appl. No.: 10/289,494

(22) Filed: Nov. 5, 2002

(65) Prior Publication Data

US 2004/0083568 A1     May 6, 2004

Related U.S. Application Data

(63) Continuation of application No. PCT/JP02/03493, filed on Apr. 8, 2002.

(30) Foreign Application Priority Data

Apr. 9, 2001   (JP)   ................ 2001-110576

(51) Int. Cl.
  *B24B 19/00*   (2006.01)
  *B24D 15/04*   (2006.01)

(52) U.S. Cl. ............... 15/218.1; 15/210.1; 15/220.4; 15/244.4; 451/59; 451/533

(58) Field of Classification Search ............. 15/118, 15/209.1, 210.1, 229.11, 218, 218.1, 244.3–244.4, 15/229.1, 220.4; 451/59, 533–4, 49; 427/402, 427/202

See application file for complete search history.

(56) References Cited

U.S. PATENT DOCUMENTS

| | | | | | |
|---|---|---|---|---|---|
| 3,638,270 A | * | 2/1972 | Schlegel et al. | ............... | 15/114 |
| 4,993,099 A | * | 2/1991 | Emura et al. | ................ | 15/118 |
| 5,016,401 A | * | 5/1991 | Mangus | ................ | 451/59 |
| 6,056,627 A | * | 5/2000 | Mizuta | ................ | 451/59 |
| 6,233,774 B1 | * | 5/2001 | Vogt | ................ | 15/104.93 |
| 6,702,652 B2 | * | 3/2004 | Arai | ................ | 451/41 |
| 6,741,086 B2 | * | 5/2004 | Maekawa et al. | ........... | 324/754 |
| 2003/0106178 A1 | * | 6/2003 | Martin | ................ | 15/210.1 |

FOREIGN PATENT DOCUMENTS

| JP | 7-244074 | 9/1995 |
|---|---|---|
| JP | 10-300777 | 11/1998 |
| JP | 10/339766 | 12/1998 |
| JP | 2000-332069 | 11/2000 |

OTHER PUBLICATIONS

Merriam-Webster Online. www.merriamwebster.com. Term: side by side.*

* cited by examiner

*Primary Examiner*—Gladys J P Corcoran
*Assistant Examiner*—Shay L. Karls
(74) *Attorney, Agent, or Firm*—Beyer Weaver

(57) ABSTRACT

A device for cleaning the tip portion and the side surfaces of a probe has two or more different kinds of intermediate sheets affixed to a substrate in a side-by-side relationship with respect to each other. One of these intermediate sheets is an elastic sheet having an elastic property. Another intermediate sheet of a different kind is a plastic sheet which is less elastic. The tip portion of a probe is cleaned by a polishing layer affixed to the elastic sheet. The side surfaces of the probe are cleaned by a polishing layer affixed to the plastic sheet. A porous foamed sheet having openings on its surface and having air bubbles inside may be used as the elastic sheet. A polishing layer is formed on the surface of the foamed sheet, having a porous surface with openings corresponding to the openings on the foamed sheet. A spacer may be provided between the substrate and the plastic sheet for adjusting the heights of the polishing layers formed over the intermediate sheets.

5 Claims, 3 Drawing Sheets

DEVICE FOR CLEANING TIP AND SIDE SURFACES OF A PROBE

This application is a Continuation application of prior-filed International (designating the United States) Application No. PCT/JP02/03493 filed on Apr. 8, 2002, which claims priority based on Japanese Patent Application 2001-110576 filed on Apr. 9, 2001 from which priority is claimed.

BACKGROUND OF THE INVENTION

This invention relates to a cleaning device for removing foreign substances attached to the tip and/or side surfaces of a probe used for inspecting a planar target object such as a semiconductor device having integrated circuits installed thereon.

Chips are produced by installing semiconductor elements and integrated circuits on a semiconductor wafer through various wafer-producing processes. The chips thus produced on a semiconductor wafer are cut off from the wafer after a current-passing test and are packaged. Tests with a current are carried out also before and after the packaging to separate faulty products stringently from qualified products.

Such current-passing tests are carried out by means of a test apparatus of a known kind such as a wafer prober. A position-matching process by moving a prober needle ("probe") serving as an electrode of a tester and the electrodes on the chip (pads or lead lines) and a contacting process between the probe and the chip electrodes are repeated for carrying out electrical measurements of different kinds.

While such position-matching and contacting processes are repeated by moving the probe and the electrodes on the chips, the tip of the probe slides over the electrodes on the chips, scraping off portions of the electrodes. Such portions of the electrodes that have been scraped off become attached to the tip and the side surfaces of the probe as foreign substances.

The foreign substances that have thus become attached to the probe may be metals such as aluminum. If such a metal is oxidized, the electrical contact resistance between the probe and the electrodes on the chip becomes larger, making it impossible to carry out accurate electrical measurements. Thus, it is necessary to clean the tip portion of the probe regularly after each time a specified number of contact processes have been carried out in order to remove such foreign substances from the probe.

Removal of such foreign substances from the tip portion of a probe is carried out by using the same apparatus used for the current-passing tests such as the aforementioned wafer prober, except the target object to be tested such as a semiconductor wafer attached to the apparatus is replaced with a cleaning device having a similar shape. Examples of a prior art cleaning device of this kind include hard polishing plates of a grinding stone, glass and a ceramic material (as disclosed, for example, in Japanese Patent Publications Tokkai 7-199141, 5-209896, 5-166893, 4-96342, 3-105940, 3-10176, 3-76242, 2-2939 and 1-282829), as well as devices with a polishing layer formed on an uneven surface of an elastic member having protrusions and indentations (as disclosed, for example, in Japanese Patent Publication Tokkai 2000-332069). The probe is pressed against the surface of such a cleaning device, as done in the aforementioned current-passing test.

If a polishing plate of a hard material is used as the cleaning device and the probe is pressed too hard against it, its tip portion will become deformed and hence it is necessary to reduce the pressure with which the probe can be pressed against the cleaning device. As a result, only the portions very close to the tip can be cleaned. If a cleaning device of the type with a polishing layer formed on an elastic member is used, on the other hand, side surfaces of the probe can be cleaned but its tip cannot be cleaned sufficiently. Thus, the common practice has been to provide separately a device for cleaning the tip and another device for cleaning the side surfaces, attaching them to a current-passing test apparatus consecutively one at a time. It was therefore both cumbersome and time-consuming to clean a probe.

SUMMARY OF THE INVENTION

It is therefore an object of this invention in view of the above to provide a cleaning device with a simple structure capable of cleaning both the tip and the side surfaces of a probe.

A cleaning device embodying this invention, with which the above and other objects of the invention can be accomplished, may be characterized as comprising a substrate and intermediate sheets of at least two different kinds affixed on the substrate in a side-by-side relationship with respect to each other. One of these intermediate sheets is an elastic sheet having an elastic property. Another intermediate sheet of a different kind is a plastic sheet which is less elastic. The tip portion of a probe is cleaned by a polishing layer affixed to the elastic sheet. The side surfaces of the probe are cleaned by a polishing layer affixed to the plastic sheet. A porous foamed sheet having openings on its surface and having air bubbles inside may be used as the elastic sheet. A polishing layer is formed on the surface of the foamed sheet, having a porous surface with openings corresponding to the openings on the foamed sheet. A spacer with an intermediate sheet affixed thereon may be provided for adjusting the heights of the polishing layers formed individually on the intermediate sheets. A circular or quadrangular metallic sheet with an orientation flat or notches on the circumference may be used as the substrate. With the present invention as described above, foreign substances attached to the tip part and the side surfaces of a probe can be removed without damaging the tip part by means of a single cleaning device. A high level of cleaning efficacy can be obtained according to this invention because appropriate intermediate sheets can be selected for the cleaning device, depending on the quantity of the foreign substances to be removed and the strength of their attachment to the probe.

DETAILED DESCRIPTION OF THE INVENTION

Figure 1A:
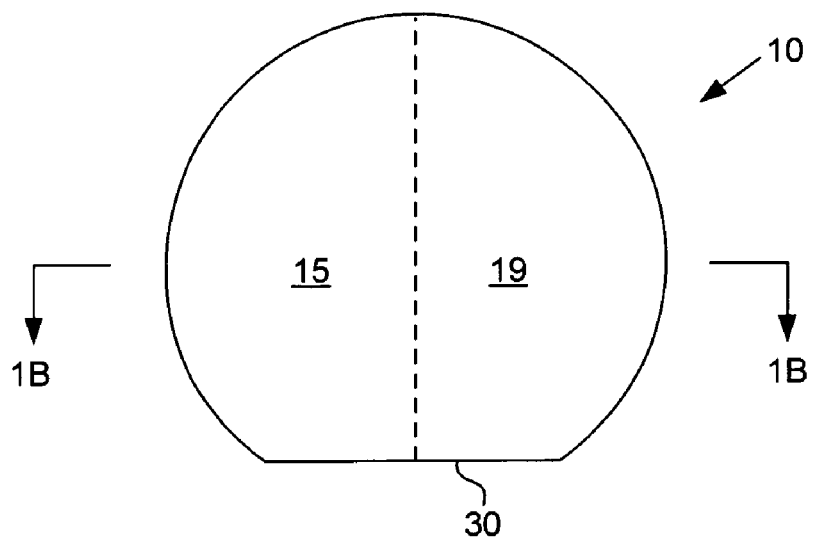
FIG. 1A is a plan view of a cleaning device embodying this invention and FIG. 1B is a sectional view taken along line 1—1B of FIG. 1B.
Figure 1B:
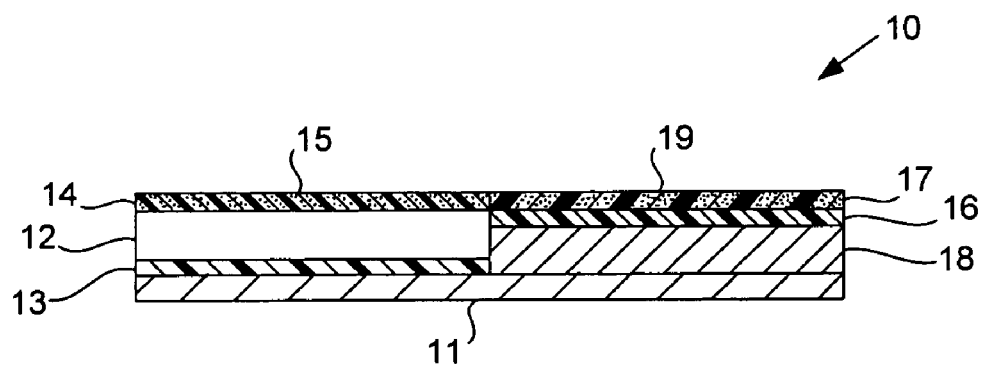
Figure 3:
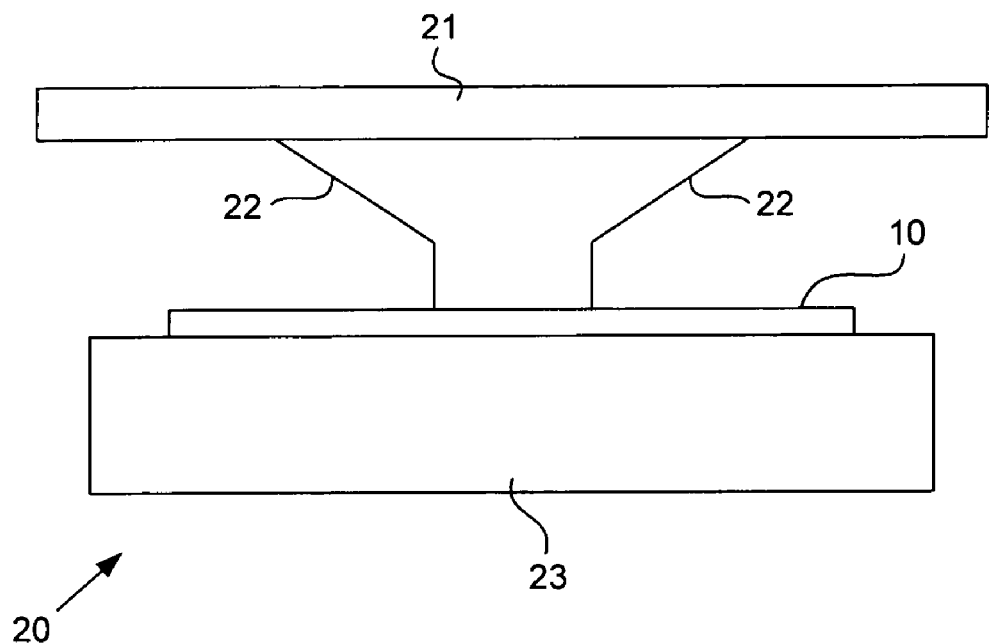
FIG. 3 is a schematic side view of a wafer prober.

The invention relates to a cleaning device intended to be set on a wafer prober of a known type such as shown in FIG. 3 for cleaning the tip portions of a probe. As shown in FIGS. 1A and 1B, such a cleaning device 10 embodying this invention is characterized as having a single polishing surface area 15 for cleaning side surfaces of a probe and another single polishing surface area 19 for cleaning the tip of the probe.

As shown in FIG. 1B, the cleaning device 10 is formed with a substrate 11, intermediate sheets of two different kinds affixed next to each other in a side-by-side relationship sideways on the surface of the substrate 11 (that is, not in the positional relationship of being one on top of the other but in a direction parallel to the substrate surface), and polishing layers 14 and 17 formed respectively on the surface of a corresponding one of the intermediate sheets. One of these two intermediate sheets is an elastic sheet 12 having an elastic property and the other is a plastic sheet 16.

According to the example shown in FIG. 1A, the substrate 11 is circular, having a so-called orientation flat 30 serving as a positioning mark to have the cleaning device 10 set on the wafer prober (shown in FIG. 3) with a correct orientation such that the relative position of the probe with reference to the cleaning device 10 can be correctly adjusted. For this purpose, a substrate having notches on its circumference may be used instead. As further examples, non-circular substrates such as quadrangular substrates may be used, although not separately illustrated. The substrate 11 is preferably of a relatively hard material such as a metallic or plastic material that is not easily deformed. The material and the shape of the substrate 11 may be appropriately varied.

Figure 2A:
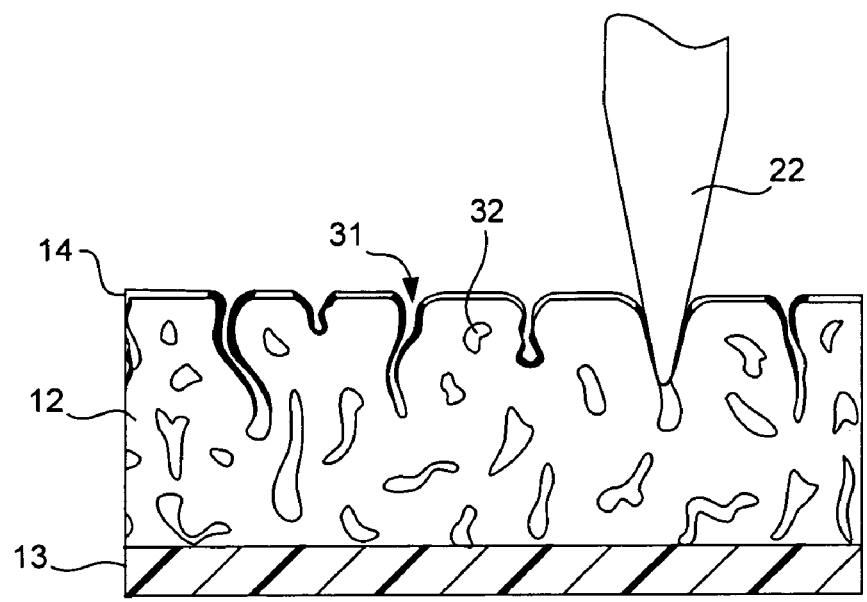
FIG. 2A is a sectional view of a portion of the cleaning device of FIGS. 1A and 1B where a foamed sheet is formed.

FIG. 2A shows an example wherein the elastic intermediate sheet 12 is a porous foamed sheet, attached to a backing sheet 13, having openings 31 on its externally exposed surface and air bubbles 32 inside. Such a foamed sheet 12 can be produced by applying a foaming liquid such as urethane on the surface of a backing sheet 13 such as a plastic sheet, foaming this liquid to form a foamed layer on the surface of the backing sheet 13 and then removing surface portions of this foamed layer by means of a knife or by a buffing process such that the openings 31 reaching into the interior are formed on the surface.

The polishing layer 14 is formed on the surface of this foamed sheet 12 preferably so as to also have openings on its porous surface, corresponding to the openings 31 on the surface of the foamed sheet 12, as shown in FIG. 2A. With a polishing layer thus formed with a porous surface, the tip portion of a probe 22 enters the interior of a surface opening of the polishing layer 14 as the probe 22 is pressed against the surface of the polishing layer 14, as shown in FIG. 2A. Foreign substances attached to the side surfaces of the probe 22 can thus be cleaned off without causing any damage to its tip portion.

This intermediate sheet may be affixed to the surface of the substrate 11 by attaching a double-surface adhesive sheet on the back surface of the intermediate sheet (or the back surface of its backing sheet, as in the present example) or through a layer of a glue or an adhesive applied on the substrate surface.

Figure 2B:
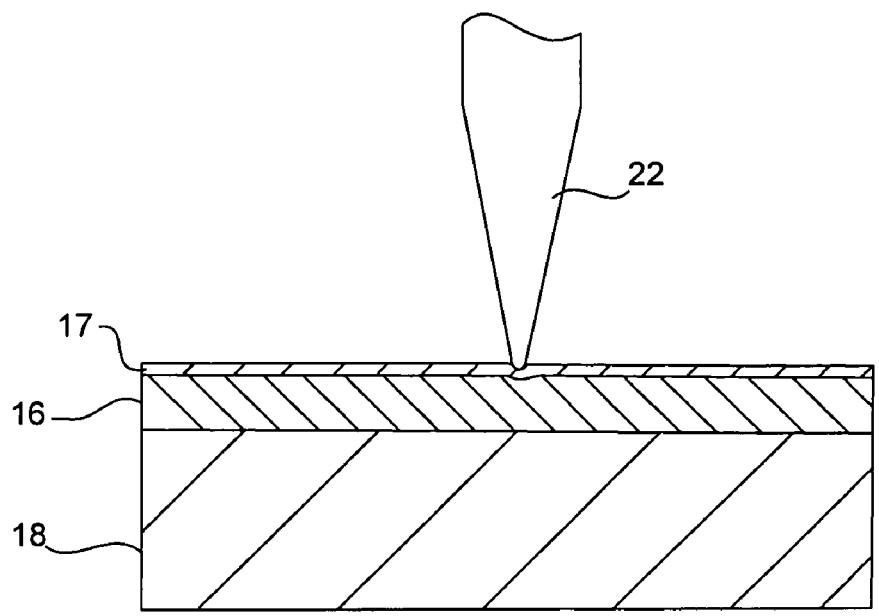
FIG. 2B is a sectional view of another portion thereof where a plastic sheet is formed.

The other intermediate sheet 16 may be a plastic sheet of a known plastic material such as polyester, polyethylene terephthalate (PET) and polypropylene with a flat outer surface. This plastic sheet 16 is less elastic than the aforementioned foamed sheet 12 and serves to clean the tip portion of the probe 22, as shown in FIG. 2B, through a polishing layer 17 formed on the surface thereof.

Although the illustrated example has two intermediate sheets of different kinds arranged next to each other on the surface of the substrate 12, this is not intended to limit the scope of the invention. Three or more intermediate sheets of mutually different kinds may be similarly arranged on and affixed to the surface of the substrate 12. As such an additional intermediate sheet, a sheet of a woven or non-woven cloth material may be used, a polishing layer being formed on the surface thereof and using a backing sheet such as a double-surface adhesive tape to attach to the substrate 11. In other words, different kinds of intermediate sheets may be selected, depending on the situation.

The polishing layers 14 and 17 on the intermediate layers as described above may be formed by applying a polishing paint, having abrading particles of a known kind comprising particles of alumina, silicon carbide, cerium oxide or diamond of average diameter 1–2 µm dispersed in a polyester or urethane resin solution, onto the surface of the intermediate sheet and then drying it. Such a flat polishing layer may be formed uniformly over the entire surfaces of the intermediate sheets or may be distributed in linear forms or in a pattern with independently separated dotted areas.

According to the example shown in FIG. 1B, the plastic intermediate sheet 16 is affixed to the surface of the substrate 11 through the intermediary of a spacer 18. Since the polishing layer 17 formed on this plastic sheet 16 has a flat top surface 19, the distance between the probe 22 and this surface 19 can be measured accurately. The spacer 18 serves to match the height of the polishing layer 17 (or its top surface 19) on the plastic sheet 16 with that of the polishing layer 14 (or its top surface 15) on the aforementioned foamed sheet 12. The spacer 18 may be made of a hard material such as a metallic material or a plastic material.

The cleaning device 10 thus structured may be set to the wafer prober 20 shown in FIG. 3 for cleaning the probe 22. The cleaning device 10, instead of a target object such as a semiconductor wafer to be inspected, is set on an attachment table 23 which is moved horizontally and vertically for positioning while the cleaning device 10 is pressed against the probe 22 of a probe card 21. When the tip of the probe 22 is to be cleaned, the surface area 19 on top of the polishing layer 17 above the plastic sheet 16 is moved to the position of the probe 22. When side surfaces of the probe 22 is to be cleaned, the surface area 15 on top of the polishing layer 14 above the foamed sheet 12 is moved to the position of the probe 22. Such positioning can be effected accurately, for example, by means of a computer.

The invention is described next by way of a test example wherein a cleaning device embodying this invention was produced with a foamed polyurethane sheet having its surface portions removed by buffing and having air bubbles exposed on its surface and a polyethylene terephthalate (PET) sheet serving as two intermediate sheets. For this purpose, a polishing paint was produced by dispersing alumina particles with average diameter of 1 µm in a urethane resin solution and it was applied by a reverse coating method on a foamed polyurethane sheet of thickness 500 µm and a PET sheet of thickness 100 µm and then dried to form a polishing layer of thickness 10 µm on the surface of each of these two sheets. A circular metallic disk with an orientation flat was used as the substrate. The aforementioned foamed polyurethane sheet was affixed to one half of the surface area of this metallic disk by means of an adhesive. After a semi-circular metallic spacer of thickness 400 µm was affixed to the remaining half of the surface area of the substrate, the aforementioned PET sheet was affixed to the top surface of this spacer to produce a cleaning device embodying this invention.

What is claimed is:

1. A cleaning device for cleaning a tip portion and side surfaces of a probe, said cleaning device comprising:
    a substrate;
    intermediate sheets of at least two different kinds affixed to different parts of a surface area of said substrate in a side-by-side relationship sideways with respect to each other, one of said intermediate sheets being an elastic sheet having an elastic property, the other of said at least two kinds of intermediate sheets being a plastic sheet with a less elastic property; and a polishing layer on said elastic sheet and another polishing layer on said plastic sheet, both of the polishing layers having abrading particles dispersed in a resin.

2. The cleaning device of claim 1 wherein said elastic sheet is a porous foamed sheet having a surface with openings and having air bubbles inside.

3. The cleaning device of claim 2 wherein the polishing layer formed on said elastic sheet has a porous surface with openings corresponding to the openings on the surface of said foamed sheet.

4. The cleaning device of claim 1 further comprising a spacer which is affixed to said substrate and to said another polishing layer formed on said plastic sheet, said plastic sheet being affixed to a surface of said spacer, and said spacer serving to adjust a height of said another polishing layer formed on said plastic sheet.

5. The cleaning device of claim 1 wherein said substrate is approximately circular having an orientation flat.

* * * * *